US006251182B1

(12) United States Patent
Luna et al.

(10) Patent No.: US 6,251,182 B1
(45) Date of Patent: Jun. 26, 2001

(54) SUSCEPTOR FOR FLOAT-ZONE APPARATUS

(75) Inventors: Joaquin Enrique Luna, Saginaw; Scott Allen Wheelock, Freeland, both of MI (US)

(73) Assignee: Hemlock Semiconductor Corporation, Hemlock, MI (US)

( * ) Notice: Subject to any disclaimer, the term of this patent is extended or adjusted under 35 U.S.C. 154(b) by 0 days.

(21) Appl. No.: 08/060,767

(22) Filed: May 11, 1993

(51) Int. Cl.[7] .................................................. C30B 13/16
(52) U.S. Cl. ................................. 117/49; 23/301
(58) Field of Search ............................. 23/301; 156/603, 156/604, 608, DIG. 98; 422/245, 246

(56) References Cited

U.S. PATENT DOCUMENTS

| 3,477,959 | * | 11/1969 | Colton | 422/245 |
| 3,935,059 | * | 1/1976 | Ayel | 156/620.4 |
| 4,045,181 | | 8/1977 | Burd et al. | 23/273 R |
| 4,247,859 | * | 1/1981 | Rai-Choudhury et al. | 357/4 |
| 4,912,528 | * | 3/1990 | Hwang et al. | 356/36 |

FOREIGN PATENT DOCUMENTS 1081827 9/1967 (GB).

* cited by examiner

Primary Examiner—Felisa Hiteshew
(74) Attorney, Agent, or Firm—William F. Boley

(57) ABSTRACT

The present invention is an improved susceptor for a float-zone apparatus for the float-zone processing of silicon elements. The susceptor is of a cylindrical design which allows the susceptor to be positioned around a free end of a silicon element to heat the free end of the silicon element to facilitate inductive coupling of the free end of the silicon element with an RF induction coil heater. In a preferred embodiment of the present invention, the susceptor is formed from tantalum.

7 Claims, 1 Drawing Sheet

SUSCEPTOR FOR FLOAT-ZONE APPARATUS

BACKGROUND OF INVENTION

The present invention is an improved susceptor for a float-zone apparatus for the float-zone processing of silicon elements. The susceptor is of a cylindrical design which allows the susceptor to be positioned around a free-end of a silicon element to heat the free-end of the silicon element to facilitate inductive coupling of the free-end of the silicon element with an RF induction coil heater. In a is preferred embodiment of the present invention, the susceptor is formed from tantalum.

Apparatuses for the float-zone processing of silicon are well known in the art and are described for example in British Patent No. 1,081,827, published Sep. 6, 1967, and in Burd et al., U.S. Pat. No. 4,045,181, issued Aug. 30, 1977, both of which are incorporated by reference herein. Hwang et al., co-pending U.S. patent application Ser. No. 07/942,907, filed Sep. 10, 1992, describes a method of analyzing chunked silicon for contaminates, where the chunked silicon is float-zone processed to effect distribution of contaminates into the bulk of a monocrystal of silicon. In addition, apparatuses and procedures for the float-zone processing of silicon are described extensively in Keller et al., Preparation and Properties of Solid State Materials: Floating-Zone Silicon, Vol. 5, Marcel Dekker, Inc., New York, N.Y., 1981.

Standard procedures for the float-zone processing of silicon employ a radio frequency (RF) induction coil heater to create a melt zone through a cross-section of a silicon element. This melt zone can then be caused to move along the length of the silicon element to provide for refinement of the silicon element and effect formation of the silicon element into a monocrystal of silicon.

It is known that the amount of RF energy which is necessary to coupled a RF induction coil heater with a silicon element is inversely proportional to the resistivity of the silicon element. Therefore because relatively pure silicon, such as semiconductor grade silicon, has high resistivity at ambient temperature it is difficult to start the inductive heating of the silicon element. To overcome this resistance to inductive heating, float-zone apparatuses typically contain a susceptor which couples with the RF induction coil heater more readily than the silicon element and provides radiant heat to the silicon element to decrease its resistivity. These susceptors are typically solid carbon or graphite elements which are positioned in close proximity to the silicon element, but do not surround a free end of the silicon element.

Therefore, it is an objective of the present invention to provide an improved apparatus for the float-zone processing of silicon, the improvement comprising a cylindrical susceptor positionable around the free end of a silicon element to effect preheating of the free end of the silicon element and facilitate inductive coupling of the free end of the silicon element with an RF induction coil heater. The cylindrical susceptor when positioned around the free end of a silicon element and heated by RF coupling with the RF induction coil heater of a float-zone apparatus provides more uniform and effective heating of the free end of the silicon element. The cylindrical susceptor is particularly useful for the preheating of irregular-shaped silicon elements such as described in Hwang, supra. In a preferred embodiment of the present invention the cylindrical susceptor is formed from tantalum.

SUMMARY OF INVENTION

The present invention is an improved susceptor for a float-zone apparatus for the float-zone processing of silicon elements. The susceptor is of a cylindrical design which allows the susceptor to be positioned around a free end of a silicon element to heat the free end of the silicon element to facilitate inductive coupling of the free-end of the silicon element with an RF induction coil heater. In a preferred embodiment of the present invention, the susceptor is formed from tantalum.

DESCRIPTION OF INVENTION

The present invention is an improved susceptor for a float-zone apparatus for the float-zone processing of a silicon element. More specifically, in combination with a float-zone apparatus for processing a silicon element, the apparatus having an RF induction coil heater and an element holder and a seed holder aligned vertically above and below the heating coil, the element holder being adapted to hold one end of a silicon element and the seed holder being adapted to hold a seed crystal of silicon, means for positioning the element holder relative to the RF induction coil heater to bring the free end of the silicon element into proximity with the RF induction coil heater to melt the free end of the silicon element forming a molten zone, and means for positioning the seed holder relative to the RF induction coil heater so that the seed crystal contacts and fuses with the molten zone, and means for varying the relative position of the RF induction coil heater to the silicon element such that the molten zone is moved along the length of the silicon element, the improvement comprising: a cylindrical susceptor positionable around the free end of the silicon element.

Figure 1:
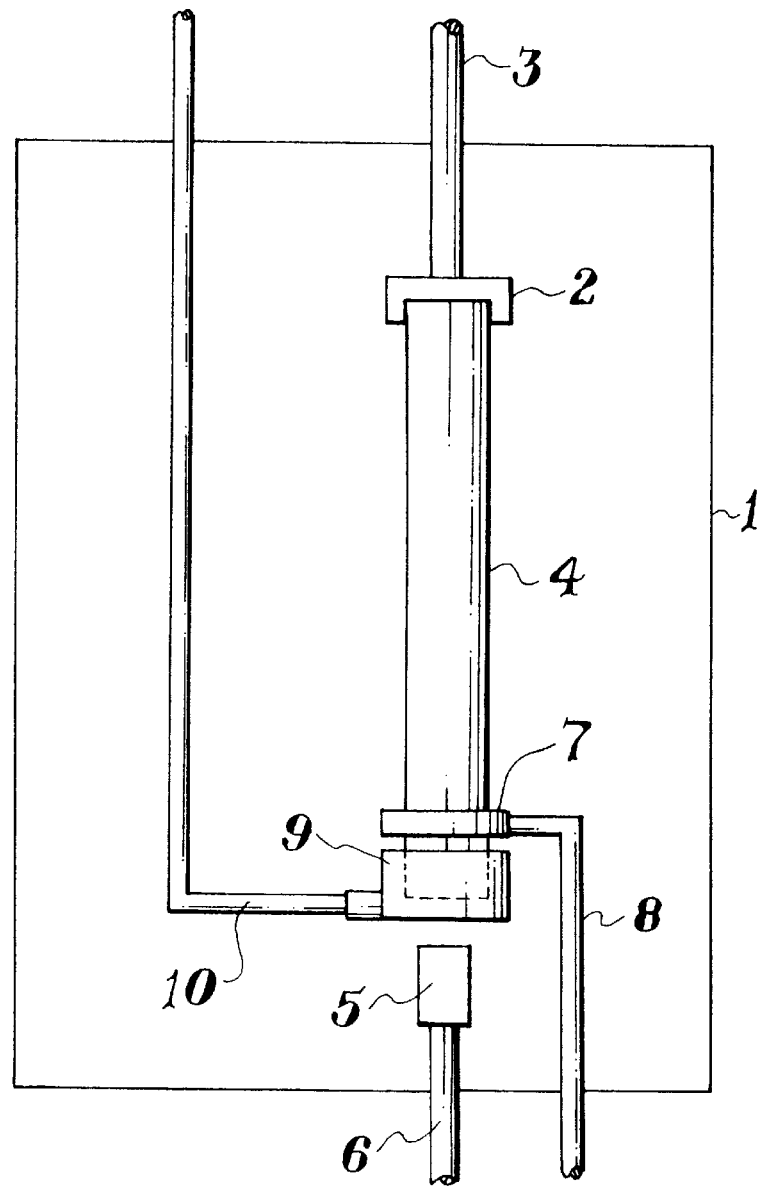
FIG. 1 illustrates selected elements of a float-zone apparatus comprising the improved susceptor of the present invention.

FIG. 1 illustrates elements of a float-zone apparatus comprising the improved susceptor of the present invention. The float-zone apparatus comprises housing 1, which is essentially sealed such that the float-zone process can be run under vacuum or an inert atmosphere such as argon. Preferred is when float-zone apparatus is purged with argon and maintained under an argon purge during conduct of the floating-zone process. Positioned within housing 1 is element holder 2. Element holder 2 has a lower end for retaining a silicon element and an upper end connected to positioning rod 3. Positioning rod 3 extends through the upper wall of housing 1 and allows element holder 2 to be positioned vertically within housing 1. The end of positioning rod 3 external to housing 1 may be connected to standard means for rotating positioning rod 3 and attached element holder 2. The lower-end of element holder 2 can be of standard design for retaining a silicon element, for example a chuck.

Silicon element 4 is secured in element holder 2. Vertically aligned beneath element holder 2 within housing 1 is seed holder 5. Seed holder 5 has an upper end for retaining a seed crystal of silicon and a lower end connected to positioning rod 6 which extends through the lower wall of housing 1. The vertical position of seed holder 5 can be adjusted within housing 1 by means of positioning rod 6 to bring a crystal of silicon into contact with a molten zone formed on the free-end of silicon element 4. In addition, positioning rod 6 can be rotated by standard means to effect rotation of a seed crystal positioned on seed holder 5. Those skill in the art will recognize that the position of the element holder and seed holder can be reversed in the float-zone apparatus if desired. However, the preferred configuration of the float-zone apparatus is that illustrated in FIG. 1, where the element holder is located over the seed holder. Silicon element 4 can be of conventional size and shape known in the art. However, the present invention is particularly useful for float-zone processing of irregular shaped silicon elements such as chunks as described in Hwang et al., co-pending U.S. patent application Ser. No. 07/942,907, filed Sep. 10, 1992, and hereby incorporated by reference.

Located in housing 1 is RF induction coil heater 7. RF induction coil heater 7 is positioned within housing 1 by means of positioning rod 8 and is connected to a suitable power supply by standard means not shown. Although FIG. 1 illustrates a movable RF induction coil heater, those skilled in the art will recognize that RF induction coil heater 7 can be fixed within housing 1 and silicon element 4 moved in respect to the coil to effect passing of a melt zone along the length of the silicon element. The design of RF induction coil heater 7 is not critical to the present invention and can be those designs known in the art. However it is preferred that RF induction coil heater 7 have an inside diameter larger than the diameter of the silicon element to be float zoned, since this allows for more convenient positioning and removal of the cylindrical susceptor.

Also located within housing 1 is cylindrical susceptor 9. The position of cylindrical susceptor 9 within housing 1 is controlled and maintained by means of positioning rod 10.

The function of the cylindrical susceptor in the present invention is to serve as a preheater of a silicon element to be float-zoned in the float-zone apparatus. Silicon, particularly high-purity silicon such as semiconductor grade silicon, has a high resistivity which makes RF induction coupling to the silicon difficult at typical ambient temperatures. However, as silicon is heated to temperatures above about 500° C. the resistivity of silicon is reduced and RF inductive coupling is facilitated. Preferred, is when the silicon is preheated to temperatures within a range of about 700° C. to 1000° C.

The cylindrical susceptor is heated by RF inductive coupling with the RF induction coil heater of the present invention. Therefore, to be effective in the present invention the cylindrical susceptor must be formed from a material having less resistivity than the silicon element to be zoned. Also, it is desirable that the cylindrical susceptor be formed from a material that does not cause significant contamination of the silicon element. It is preferred that the material of construction for the cylindrical susceptor be selected from a group consisting of carbon, graphite, silicon carbide coated graphite or carbon, molybdenum, tungsten, and tantalum. Most preferred is when the cylindrical susceptor is formed from tantalum.

Figure 2:
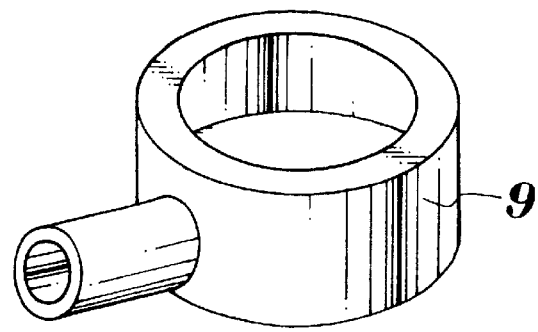
FIG. 2 illustrates an embodiment of the improved susceptor comprising the present invention.

The cylindrical susceptor is cylindrical in shape. By "cylindrical" it is meant that the susceptor has a cross-section that is generally round or oval and has a bore running the length of the susceptor. An example of one embodiment of the cylindrical susceptor is provided in FIG. 2. The bore of the cylindrical susceptor must be large enough to allow the cylindrical susceptor to be positioned around the free end of the silicon element. Therefore, the exact size of the bore will be dictated by the diameter of the portion of the silicon element around which the cylindrical susceptor is to be positioned. The optimal wall thickness of the cylindrical susceptor will depend upon the material of construction. In general, when the cylindrical susceptor is constructed from tantalum a wall thickness of about 0.3 mm to 5 mm is considered useful. A thinner wall thickness tends to make the cylindrical susceptor brittle and subject to breakage, while a thicker wall requires greater coupling energy with no perceived advantage. When the cylindrical susceptor is formed from tantalum a preferred wall thickness is within a range of about 0.5 mm to 1.5 mm.

An example of how the cylindrical susceptor of the present invention can be employed in a float-zone apparatus can be explained by reference to FIG. 1. In FIG. 1, RF induction coil heater 7 is positioned around and slightly above the free end of silicon element 4. Cylindrical susceptor 9 is then positioned around the free end of silicon element 4. RF induction coil heater 7 is brought into close enough proximity to cylindrical susceptor 9 to allow RF inductive heating of cylindrical susceptor 9. Energy is applied to RF induction coil heater 7 by standard means causing cylindrical susceptor 9 to become hot and radiate heat to silicon element 4. When a melt is formed at the free end of silicon element 4, power is momentarily disengaged from RF induction coil heater 7, and cylindrical susceptor 9 is quickly lowered and rotated away from silicon element 4. Power is then reapplied to RF induction coil heater 7 and zoning of silicon element 4 is effected by standard methods of operation for float-zone apparatuses. The float-zone apparatus comprising the improved susceptor may be used for float-zone refining of semiconductor grade silicon and for floating zone conversion of polycrystalline semiconductor grade silicon into semiconductor grade monocrystalline silicon.

We claim:

1. In combination with a float-zone apparatus for processing a silicon element, the apparatus having an RF induction coil heater and an element holder and a seed holder aligned vertically above and below the RF induction coil heater, the element holder being adapted to hold one end of a silicon element and the seed holder being adapted to hold a seed crystal of silicon, means for positioning the element holder relative to the RF induction coil heater to bring the free end of the silicon element into proximity with the RF induction coil heater to melt the free end of the silicon element forming a molten zone, and means for positioning the seed holder relative to the RF induction coil heater so that the seed crystal contacts and fuses with the molten zone, and means for varying the relative position of the RF induction coil heater to the silicon element such that the molten zone is moved along the length of the silicon element, the improvement comprising: a cylindrical susceptor positionable around the free end of the silicon element.

2. A float-zone apparatus according to claim 1, where the cylindrical susceptor is formed from a material selected from a group consisting of carbon, graphite, silicon carbide coated carbon or graphite, molybdenum, tungsten, and tantalum.

3. A float-zone apparatus according to claim 1, where the cylindrical susceptor is formed from tantalum.

4. A float-zone apparatus according to claim 1, where the cylindrical susceptor is formed from tantalum and the cylindrical susceptor has a wall thickness within a range of about 0.3 mm to 5 mm.

5. A float-zone apparatus according to claim 1, where the cylindrical susceptor is formed from tantalum and the cylindrical susceptor has a wall thickness within a range of about 0.5 mm to 1.5 mm.

6. In combination with a float-zone apparatus for processing a semiconductor grade silicon element of irregular shape, the apparatus having an RF induction coil heater and an element holder and a seed holder aligned vertically above and below the RF induction coil heater, the element holder being adapted to hold one end of the semiconductor grade silicon element and the seed holder being adapted to hold a seed crystal of monocrystalline silicon, means for positioning the element holder relative to the RF induction coil heater to bring the free end of the semiconductor grade silicon element into proximity with the RF induction coil heater to melt the free end of the semiconductor grade silicon element forming a molten zone, and means for positioning the seed holder relative to the RF induction coil heater so that the seed crystal contacts and fuses with the molten zone, and means for varying the relative position of the RF induction coil heater to the silicon element such that the molten zone is moved along the length of the semiconductor grade silicon element, the improvement comprising:

a tantalum cylindrical susceptor positionable around the free end of the semiconductor grade silicon element of irregular shape.

7. In a method for float-zone processing of a semiconductor grade silicon element of irregular shape in a float-zone apparatus, the improvement comprising: positioning a tantalum cylindrical susceptor around a free end of a semiconductor grade silicon element of irregular shape and heating the cylindrical susceptor by RF inductive coupling to an RF induction coil heater to provide radiant heat to the free end of the silicon element and thereby facilitating coupling of the RF induction coil heater to the silicon element.

* * * * *